US005502004A

United States Patent [19]
Park

[11] Patent Number: 5,502,004
[45] Date of Patent: Mar. 26, 1996

[54] METHOD FOR MANUFACTURING A SEMICONDUCTOR DEVICE WITH HEAT TREATED DIFFUSION LAYERS

[75] Inventor: Chang-soo Park, Suwon, Japan

[73] Assignee: Samsung Electronics Co., Ltd., Suwon, Rep. of Korea

[21] Appl. No.: 117,580

[22] Filed: Sep. 7, 1993

[30] Foreign Application Priority Data

Oct. 5, 1992 [KR] Rep. of Korea ............ 92-18178

[51] Int. Cl.$^6$ .................................................. H01L 21/44
[52] U.S. Cl. ..................... 437/190; 437/195; 437/189; 437/192
[58] Field of Search ........................... 437/190, 195, 437/189, 192

[56] References Cited

U.S. PATENT DOCUMENTS

| | | | |
|---|---|---|---|
| 4,985,372 | 1/1991 | Narita | 437/192 |
| 5,010,032 | 4/1991 | Tang et al. | 437/192 |
| 5,094,981 | 3/1992 | Chung et al. | 437/190 |
| 5,236,868 | 8/1993 | Nulman | 437/190 |
| 5,240,880 | 8/1993 | Hindman et al. | 437/190 |
| 5,242,860 | 9/1993 | Nulman | 437/190 |
| 5,266,521 | 11/1993 | Lee et al. | 437/190 |
| 5,270,254 | 12/1993 | Chen et al. | 437/190 |
| 5,278,099 | 1/1994 | Maeda | 437/192 |
| 5,300,455 | 4/1994 | Vuillermoz et al. | 437/190 |
| 5,395,795 | 3/1995 | Hong et al. | 437/190 |

FOREIGN PATENT DOCUMENTS

| | | |
|---|---|---|
| 477990A | 4/1992 | European Pat. Off. . |
| 0291877 | 7/1991 | German Dem. Rep. . |
| 1276743 | 11/1989 | Japan . |
| 4067622 | 3/1992 | Japan . |
| 4214671 | 8/1992 | Japan . |

Primary Examiner—Brian E. Hearn
Assistant Examiner—Lynn A. Gurley
Attorney, Agent, or Firm—Cushman Darby & Cushman

[57] ABSTRACT

In a method for forming a metal wiring layer of a semiconductor device an insulating layer is formed on a semiconductor substrate having impurity-doped regions. A contact hole is formed in the insulating layer to expose an impurity-doped semiconductor region. Thereafter, a diffusion barrier layer is formed on the inner surface of the contact holes and on the surface of the semiconductor substrate exposed by the contact holes. The diffusion barrier layer is heat-treated for two minutes to one hour in a vacuum at a temperature of 450° C. to 650° C. Then, a metal wiring layer of a semiconductor device is formed on the diffusion barrier layer.

5 Claims, 3 Drawing Sheets

METHOD FOR MANUFACTURING A SEMICONDUCTOR DEVICE WITH HEAT TREATED DIFFUSION LAYERS

BACKGROUND OF THE INVENTION

The present invention relates to a method for manufacturing a semiconductor device, and more particularly to a method for forming a wiring layer in contact holes of a semiconductor device.

The wiring method is regarded as being the most important matter of semiconductor device manufacturing technology, since it determines the performance (e.g., speed of operation), yield, and reliability of the devices. Metal step coverage was not a serious problem in less dense conventional semiconductor devices, because of the inherent features of devices having larger geometries, e.g., contact holes having a low aspect ratio (the ratio of depth to width) and shallow steps.

However, in recent years, with increased integration density in semiconductor devices, contact holes have become significantly smaller (having diameters less than half a micron) while impurity-doped regions formed in the surface portion of the semiconductor substrate have become much shallower. Due to the resulting higher aspect ratio of the contact holes and the larger steps with these greater-density semiconductor devices, it has become necessary to improve the conventional aluminum metallization process in order to achieve the standard design objectives of high-speed performance, high yield, and good reliability of the semiconductor device. In addition, the conventional method shows difficulty in filling contact holes having diameters less than 1 μm and, therefore, creates a void in the contact hole of a semiconductor device.

In an effort to overcome the poor step coverage of aluminum, methods of filling in the contact holes by melting aluminum are disclosed in patent publications such as Japanese Laid-open Publication No. 62-132,848, Japanese Laid-open Publication No. 63-99,545 and Japanese Laid-open Publication No. 62-109,341. In addition, a method is disclosed in U.S. Pat. No. 4,907,176, in which a first metal layer is formed at a low temperature and another metal is deposited thereon to form a second metal layer while the temperature is increased, thereby improving the step coverage.

Moreover, the present inventor has invented a method comprising the steps of depositing an aluminum or an aluminum alloy at a low temperature to form a metal layer and heat-treating the metal layer in a vacuum at a high temperature (below the melting point), thereby reflowing the particles of the metal layer. An application therefore was filed on Sep. 19, 1990 (U.S. patent application Ser. No. 07/585,218 entitled "A Method for Forming a Metal layer in a Semiconductor Device") but has now been abandoned and a continuation-in-part (CIP) application thereof is pending in the USPTO as U.S. patent application Ser. No. 07/897,294.

In addition, during the initial stages of semiconductor manufacturing, pure aluminum was employed for forming the metal wiring layer, but as temperature increases in the sintering step, the aluminum layer absorbs the silicon atoms from the silicon substrate, and therefore the conventional method generates junction spiking. For this reason, Al-1%Si which is an aluminum supersaturated with silicon, is widely used as the material for the metal wiring layer.

However, if metal wiring of a semiconductor device is formed by the use of the above Al-1%Si, when heat-treating the semiconductor wafer at a temperature higher than about 450° C. in a subsequent sintering step, Si from the Al film precipitates between the Al film and its adjacent layers form a solid state epitaxial Si-nodule in the contact holes, which may increase the resistance of a wiring layer or the contact resistance thereof.

To prevent the Al spiking due to the above-described reaction between the metal wiring layer and the silicon substrate or to prevent Si precipitations and Si-nodule formation, the formation of a diffusion barrier layers between the wiring layer and the silicon substrate or insulating layer has been suggested. For example, a method of forming a titanium nitride (TIN) film as the diffusion barrier layer on the inner surface of the contact hole is disclosed in U.S. Pat. No. 4,897,709 (Yokohama et al.). Moreover, in Japanese Laid-open Publication No. 61-183942, a method is disclosed wherein a double-layer composed of a refractory metal layer and a titanium nitride layer is formed as the barrier layer and then heat-treated. The titanium nitride layer reacts with the semiconductor substrate in the lower part of the contact hole connecting with the semiconductor substrate, so as to form the refractory metal silicide layer composed of thermally stable compounds, which can enhance the barrier effect and lower the contact resistance.

The formation of the aforementioned diffusion barrier layer becomes quite necessary due to the fact that the semiconductor device has been scaled down to dimensions of less than one micron. This diffusion barrier layer is generally heat-treated in order to improve the diffusion barrier characteristic. The process of heat-treating the diffusion barrier layer is conventionally performed by annealing the diffusion barrier layer under a nitrogen atmosphere. Unless the diffusion barrier layer is annealed, the junction spiking phenomenon may undesirably occur while sputtering Al or an Al-alloy at a temperature of 450° C. or higher, or during the subsequent sintering thereof.

FIGS. 1 through 4 are sectional views showing an example of forming a wiring layer on the semiconductor substrate by the use of a conventional diffusion barrier layer.

FIG. 1 shows a step of implanting ions into the semiconductor substrate. More particularly, after forming a field oxide layer 3 on semiconductor substrate 1, for defining semiconductor substrate 1 into two parts, i.e., an active region and an isolation region, a pad oxide layer 5 is formed to a thickness of about 300 Å by a thermal oxidation. Thereafter, As is implanted at a dose of $5\times10^{15}$ atoms/cm$^2$ to thereby form the n+ impurity-doped region, and BF$_2$ is implanted at a dose of $5\times10^{15}$ molecules/cm$^2$ to thereby form the p+ impurity-doped region.

FIG. 2 shows an oxidation step. After the step of FIG. 1, an oxidation is performed at 950° C. under a dry $0_2$ atmosphere. At this time, the doped impurities shown in FIG. 1 are first activated, so as to form the n+ and p+ impurity doped regions 7 and 8.

FIG. 3 shows a step of forming a contact hole. An insulating interlayer 9 is formed and the resultant structure is annealed at 950° C. under N$_2$ atmosphere for 240 minutes so that it is planarized. Here, the doped impurities are further activated. Thereafter, a contact hole 10 is formed in insulating interlayer 9 by a conventional photolithography process.

FIG. 4 shows steps of forming a diffusion barrier layer and forming a metal wiring layer thereon. After the step of FIG. 3, titanium and titanium nitride are deposited on the whole surface of the structure, so as to form the diffusion barrier layer composed of titanium layer 11 and titanium nitride 13. Thereafter, the wafer is annealed under a nitrogen atmosphere at a temperature of 450° C. Then, on the diffusion barrier layer, an Al-Si-Cu alloy is deposited so as to form a metal layer, which is patterned by a photolithography process, so as to provide a wiring layer 15 of a semiconductor device. Thereafter, wiring layer 15 is sintered for thirty minutes at 400° C.

When the metal wiring layer is formed on the diffusion barrier layer according to the aforementioned conventional method, titanium and titanium nitride exhibit poor step coverage with respect to a contact hole having a large aspect ratio (for example, greater than 1.2) and are easily oxidized in the annealing process in the furnace, thereby producing a higher contact resistance. This phenomenon becomes especially significant for contact holes having submicron dimensions.

For solving the above-mentioned problems (for example, in order to reduce the contact resistance in the p+ contact region), Yoshikawa et al. suggested a method which comprises forming the contact holes, ion-implanting $BF_2$ at a dose of $1\times10^{15}$ molecules/cm$^2$ into the substrate, and then activating the p+ impurities by a rapid thermal annealing (RTA) for ten seconds or more at a temperature of 800° C. or higher, to thereby decrease the contact resistance in the p+ contact region (see Semiconductor World, November 1989, pp. 36–38). However, this method is unsatisfactory because an additional two-step process (ion-implantation and activation) should be supplemented, so that the metal wiring process is so complicated that it can reduce the throughput of the semiconductor device.

SUMMARY OF THE INVENTION

Therefore, the object of the present invention is to provide a method for forming a metal wiring layer, in which the contact resistance between a semiconductor substrate on which a diffusion barrier layer is formed and the metal wiring layer formed on the diffusion barrier layer may be lowered for contact holes having a large aspect ratio, so as to improve the uniformity of the contact resistance throughout the semiconductor wafer, thereby enhancing the operation speed of the semiconductor device.

To accomplish the aforementioned object, the present invention provides a method for manufacturing a semiconductor device, comprising the steps of:

(1) forming a diffusion barrier layer on a semiconductor substrate;

(2) heat-treating the diffusion barrier layer in a vacuum for a predetermined time; and (3) forming a metal wiring layer on the diffusion barrier layer. The heat-treatment may be performed for two minutes to one hour at a temperature of 450° C. to 650° C. in a vacuum chamber. Preferably, the heat-treatment is performed for five minutes to one hour at 550° C., or for two minutes to five minutes at 625° C.

After the diffusion barrier layer is heat-treated in a vacuum, it may be annealed in a furnace under a nitrogen atmosphere as in a conventional method, to improve the diffusion barrier characteristic. In spite of such annealing step, low contact resistance can be maintained.

Any conventional diffusion barrier layer may be used. Such a conventional diffusion barrier layer may be comprised of one or more materials among the transition metals, transition metal alloys and transition metal compounds. The diffusion barrier layer is preferably comprised of a first diffusion barrier layer comprised of a transition metal, and a second diffusion barrier layer comprised of a transition metal compound or a transition metal alloy formed on the first diffusion barrier layer. Examples of the transition metals include Ti, examples of the transition metal compounds includes TiN, and examples of the transition metal alloys include TiW.

The vacuum chamber is maintained under an inert gas atmosphere of 4 mTorr or less. As an example of the inert gases, Ar, $N_2$, He, etc. may be mentioned.

Further, the present invention provides a method for manufacturing a semiconductor device, comprising the steps of:

(1) forming an insulating layer on a semiconductor substrate having an impurity-doped region therein;

(2) forming a contact hole in the insulating layer, the contact hole exposing the impurity-doped region of the semiconductor substrate;

(3) forming a first diffusion barrier layer on the inner surface of the contact hole and on the surface of the semiconductor substrate exposed by the contact hole;

(4) heat-treating the first diffusion barrier layer for a predetermined time at a temperature of 450° C. to 650° C. in a vacuum;

(5) forming a metal layer on the first diffusion barrier layer; and (6) patterning the metal layer and the first diffusion barrier layer, thereby forming a metal wiring layer.

In order to improve the barrier characteristic of the diffusion barrier layer, the second diffusion barrier layer may be formed on the first diffusion barrier layer, and then the second diffusion barrier layer may be heat-treated under a nitrogen atmosphere. The heat-treatment of the second diffusion barrier layer is carried out for 30 minutes to one hour, at a temperature of 400° C. to 500° C.

According to the present invention, after the diffusion barrier layer is formed and heat-treated for a predetermined time in a vacuum, the metal wiring layer is formed. The contact resistance values of the metal wiring layer is remarkably reduced when compared to a conventional method which does not include the heat-treatment step in a vacuum, while maintaining the uniformity thereof throughout all of the contact holes.

BRIEF DESCRIPTION OF THE DRAWINGS

These and other objects, features, aspects and advantages of the present invention will become more apparent from the following detailed description of the present invention when taken in conjunction with the accompanying drawings, in which.

EXAMPLES

The present invention will be described, hereinafter, in more detail, by the following examples.

Example 1

Figure 1:
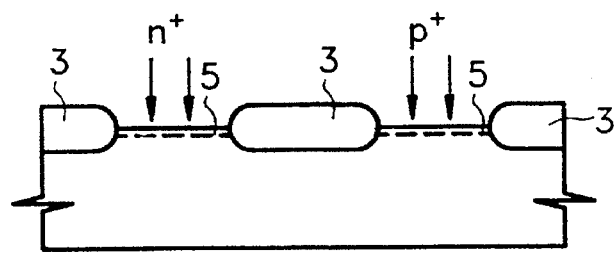
FIGS. 1 to 4 are sectional views showing a conventional method for forming the wiring layer of a semiconductor device, which makes use of a diffusion barrier layer.
Figure 2:
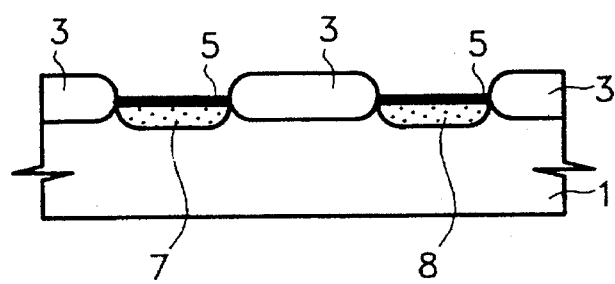
Figure 3:
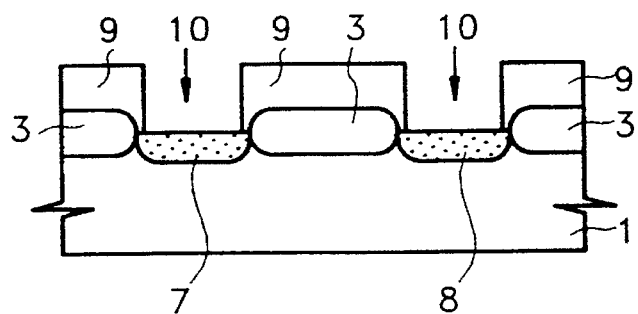
Figure 4:
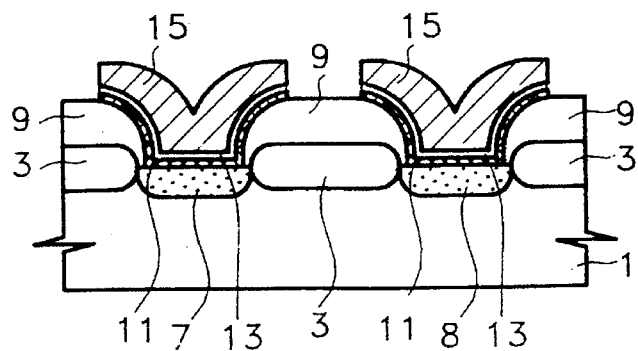
Figure 5:
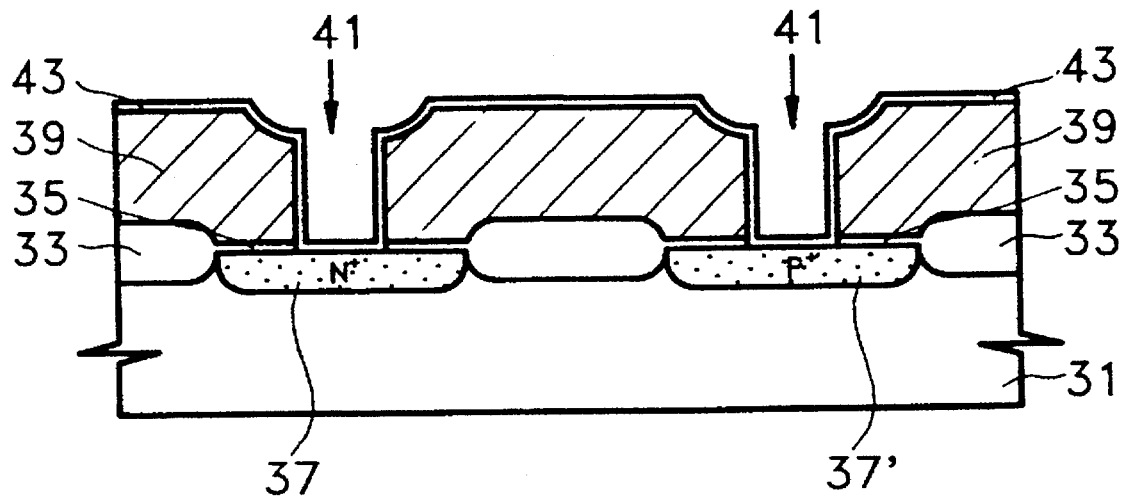
FIGS. 5 and 6 are sectional views showing an example of a method for forming a wiring layer of a semiconductor device according to the present invention.
Figure 6:
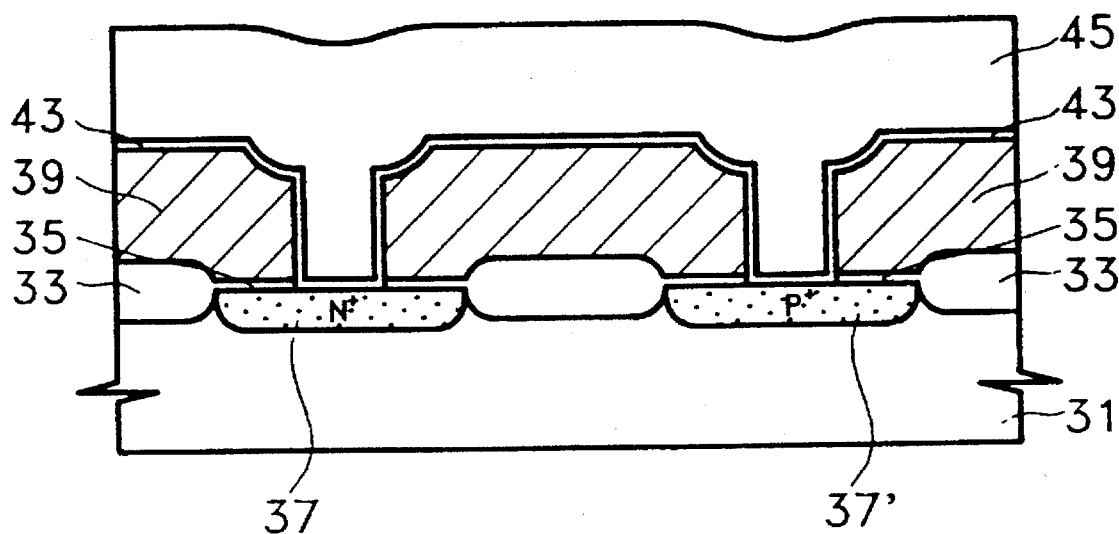

FIGS. 5 and 6 are sectional views showing an example of a method for forming a wiring layer of a semiconductor device according to the present invention.

FIG. 5 shows a step of forming a contact hole and a diffusion barrier layer. After forming a field oxide layer 33 on semiconductor substrate 31 so as to define an active region and an isolation region, a thermal oxide layer 35 was formed to a thickness of about 500 Å by the thermal oxidation. Next, ion-implantation was performed according to a conventional method, thereby implanting n+ and p+ impurities. Thereafter, the whole surface of the resultant was annealed, to activate the ion-implanted impurities, so that n+ and p+ impurity doped regions 37 and 37' were formed.

Subsequently, an insulating interlayer 39 having a thickness of about 10,500 Å, was formed on the whole surface of the resultant by the use of BPSG and then a photoresist pattern (not shown) for forming a contact hole was formed on insulating interlayer 39. The resultant structure was etched to a depth of about 3,000 Å by wet etching using a buffered oxide etchant (BOE), and then insulating interlayer 39 and thermal oxide layer 35 were etched via an reactive ion etching (RIE), until semiconductor substrate 31 was exposed, so as to form four contact holes 41 having the respective sizes (breadth/length) of 0.45/0.55 μm, 0.5/0.6 μm, 0.6/0.7 μm and 1.0/1.0 μm. (Two exemplary holes are shown in FIGS. 5–6. Next, after stripping away the photoresist pattern, a native oxide layer was removed by the use of boiled sulfuric acid and diluted hydrofluoric acid (HF).

Subsequently, on the whole surface of the resultant structure, i.e., on the inner surface of contact hole 41, the exposed surface portion of semiconductor substrate 31 and the insulating interlayer 39, a diffusion barrier layer 43 comprised of titanium was formed to a thickness of about 300 Å by a conventional sputtering method.

FIG. 6 shows the step of heat-treating the diffusion barrier layer and completing a metal layer 45. After exposing the semiconductor wafer obtained as in FIG. 5 to an ambient atmosphere, the semiconductor wafer was then kept in a chamber maintained at a $10^{-7}$ Torr vacuum. Then an inert gas, e.g., Ar was pumped into the chamber until the pressure therein reaches 4 mTorr. Thereafter, the semiconductor wafer was heat-treated for about five minutes at a temperature of 550° C.

Next, an Al-Si-Cu alloy was deposited on the whole surface of the resultant structure, so as to form a metal layer 45 on the diffusion barrier layer, and then a metal wiring layer of a semiconductor device was obtained via a conventional method.

The contact hole resistances of the thus-obtained wiring layers have been measured and the results thereof are shown in Table 1. Here, the resistance value has been measured between the two end points of a contact-chain structure. The contact chain includes metal-interconnect lines, the impurity-doped region of the semiconductor substrate, and ohmic contacts. In all of the examples according to the present invention, a contact chain structure having a serial-connection of 1,200 contact holes is employed to measure contact hole resistance.

Example 2

Except for performing the heat-treatment for fifteen minutes, the same procedure as in Example 1 has been repeated, to thereby give a wiring layer of a semiconductor device.

The contact hole resistances of the thus-obtained wiring layers have been measured, and the results thereof are shown in Table 1.

Example 3

Except for performing the heat-treatment for 30 minutes, the same procedure as in Example 1 has been repeated, to thereby give a wiring layer of a semiconductor device.

The contact hole resistances of the thus-obtained wiring layers have been measured, and the results thereof are shown in Table 1.

Example 4

The same procedure as in Example 1 except that:

1) as a diffusion barrier layer 43, a double layer composed of a first diffusion barrier layer of titanium having a thickness of about 300 Å and a second diffusion barrier layer of titanium nitride having a thickness of about 900 Å was formed; and 2) after forming diffusion barrier layer 43, the heat-treatment was performed successively for fifteen minutes without exposing the wafer to an ambient atmosphere.

The contact hole resistances of the thus-obtained wiring layers have been measured, and the results thereof are shown in Table 1.

Comparative example 1

The same procedure as Example 1 was repeated, except that, after forming the diffusion barrier layer the heat-treatment has been performed for 30 minutes at the temperature of 450° C. in a nitrogen atmospheric in a furnace according to the above-mentioned conventional method.

The contact resistances of the wiring layers thus-obtained have been measured, and the results thereof are shown in Table 1.

TABLE 1

| Contact hole size (μm) | Example 1 | | Example 2 | | Example 3 | | Example 4 | | Comparative example 1 | |
| --- | --- | --- | --- | --- | --- | --- | --- | --- | --- | --- |
| | N+ | P+ | N+ | P+ | N+ | P+ | N+ | P+ | N+ | P+ |
| 0.45/0.55 | 136 | 472 | 128 | 422 | 123 | 345 | 119 | 324 | >E6 | >E6 |
| | (9) | (34) | (3.3) | (25) | (1.6) | (12) | (1) | (9) | | |
| 0.5/0.6 | 118 | 388 | 115 | 345 | 112 | 280 | 115 | 269 | 249 | 707 |
| | (1) | (22) | (1.1) | (1.6) | (1) | (3) | (1) | (8) | (389) | (160) |
| 0.6/0.7 | 109 | 297 | 106 | 271 | 103 | 237 | 108 | 202 | 132 | 381 |
| | (0.9) | (17) | (1.1) | (14) | (2) | (11) | (1) | (7) | (8.3) | (37) |
| 1.0/1.0 | 94 | 187 | 93 | 178 | 92 | 175 | 95 | 164 | 98 | 207 |
| | (0.7) | (2.7) | (0.8) | (2.3) | (0.7) | (2) | (0.9) | (2.6) | (1.7) | (6) |

Notes:
*For Examples 1–4 and Comparative example 1, the units are ohms per contact hole.
**Resistance values are based on a contact chain structure having 1,200 contact holes.
***Numbers appearing in paranthesis represent a standard deviation throughout 44 measured points.

As can be seen in the above Table 1, the contact resistance values according to the conventional method are not particularly uniform nor high. A higher aspect ratio and a smaller contact hole diameter increases the contact resistance and non-uniformity thereof. However, in the case of forming the wiring layer according to the present invention, regardless of the kinds of the impurities in the impurity-doped region, the contact resistance value has been remarkably reduced, and the uniformity of the values of contact resistances has been improved. Moreover, as in Example 4, when, after forming the diffusion barrier layer, the heat-treatment has been successively performed without exposing the wafer to an ambient atmosphere, a lower contact resistance has been obtained when compared with the case when the diffusion barrier layer has been exposed to an ambient atmosphere after forming the diffusion barrier layer.

Example 5

FIGS. 7 through 10 are sectional views showing another example of a method for forming a wiring layer of a semiconductor device according to the present invention.

Figure 7:
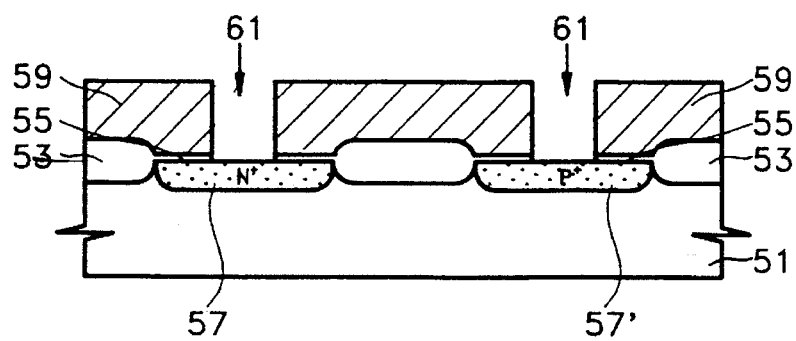
FIGS. 7 through 10 are sectional views showing another example of a method for forming a wiring layer of a semiconductor device according to the present invention.

FIG. 7 shows a step of forming a contact hole 61. After forming a field oxide layer 53 and a thermal oxide layer 55 on a semiconductor substrate 51 in the same manner as in FIG. 5 of Example 1, ion-implantation was performed to implant n+ and p+ impurities into the surface portion of the active regions of semiconductor substrate 51. Then, an annealing process was performed, to activate the p+ and n+ impurities which have been implanted, thereby forming n+ and p+ impurity-doped regions 57 and 57'.

Next, on the whole surface of the resultant structure, BPSG was deposited to form an insulating interlayer 59 with a thickness of 4,000 Å. Then a photoresist pattern (not shown) for forming a contact hole was formed on insulating interlayer 59. Thereafter, an RIE was performed by using the photoresist pattern as an etching mask to form a contact hole 61 in insulating interlayer 59, and then the photoresist pattern was stripped away. As shown in Table 1, four contact holes were formed having the respective sizes (breadth/length) of 0.45/0.55 μm, 0.5/0.6 μm, 0.6/0.7 μm and 1.0/1.0 μm.

Figure 8:
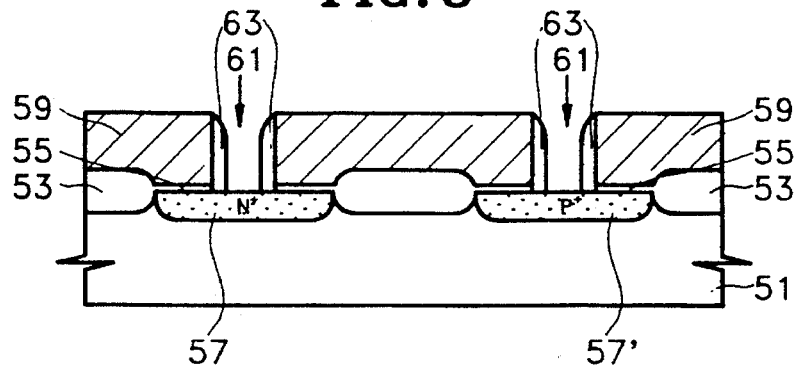

FIG. 8 shows a step of forming spacers 63 on the sidewall of contact hole 61. After the steps of FIG. 7, an oxide which exhibits good step coverage, for example, high temperature oxide (HTO), was coated on the whole surface of the resultant structure to form an insulating layer having a thickness of 1,500 Å. Subsequently, the insulating layer was anisotropically etched by an RIE method to form an oxide layer spacer 63 on the sidewall of contact hole 61. Thus, each dimension of contact hole 61 was decreased by 0.3 μm, so as to provide contact hole having the sizes of 0.15/0.25 μm, 0.2/0.3 μm, 0.3/0.4 μm and 0.7/0.7 μm, respectively.

Figure 9:
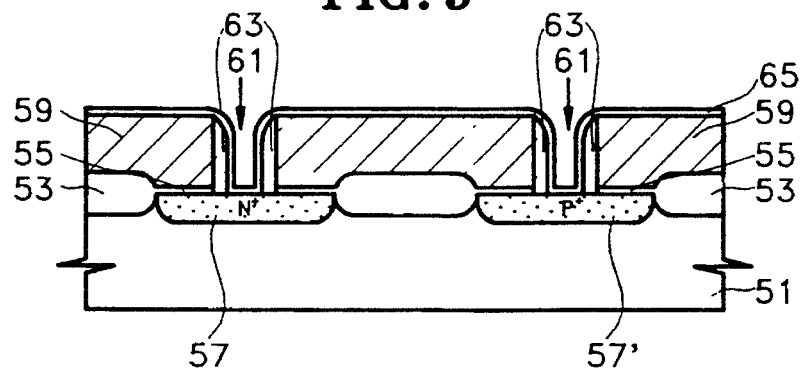

FIG. 9 shows the step of forming and heat-treating a first diffusion barrier layer 65. In the same manner as in Example 1, titanium was deposited by a sputtering method to form first diffusion barrier layer 65 having a thickness of about 200 Å to 300 Å. Next, after exposing the thus-obtained semiconductor wafer to an atmosphere and then placing the wafer into a $10^{-7}$ Torr vacuum chamber, an inert gas, e.g., Ar, was introduced into the chamber until reaching the pressure of 4 mTorr. Then, the wafer was heat-treated for two minutes at 600° C.

Figure 10:
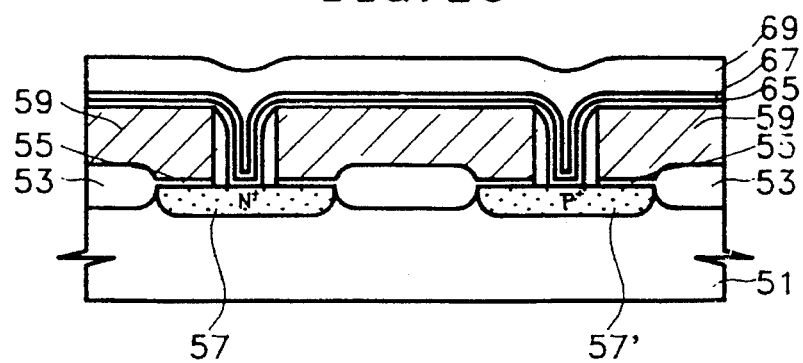

FIG. 10 shows steps of forming and heat-treating a second diffusion barrier layer 67, and forming a metal wiring layer 69. After the steps of FIG. 9, a titanium nitride was deposited on first diffusion barrier layer 65 to form second diffusion barrier layer 67 having a thickness of about 200 Å to 300 Å. Thereafter, the semiconductor wafer was heat-treated in a furnace under a nitrogen atmosphere for 30 minutes at 450° C., in the same manner as in Comparative Example 1. Then, in the same manner as in Example 1, an Al-Si-Cu alloy was deposited on the whole surface of the resultant structure so as to form a metal wiring layer 69, which was patterned to give a wiring layer of a semiconductor device according to a conventional method.

The contact hole resistances of the thus-obtained wiring layers have been measured, and the results thereof are shown in Table 2.

Example 6

The same procedure as in Example 5 was repeated except for performing the heat-treatment of first diffusion barrier layer 65 at a temperature of 625° C.

The contact hole resistances of the thus-obtained wiring layers have been measured, and the results thereof are shown in Table 2.

Comparative example 2

The same procedure as in Example 5 was repeated, except that, after forming first and second diffusion barrier layers 65 and 67, a heat-treatment process was performed in a nitrogen atmosphere for 30 minutes at 450° C. according to a conventional method.

The contact hole resistances of the thus-obtained wiring layers have been measured, and again, the results thereof are shown in Table 2.

TABLE 2

| Contact hole size (μm) | Example 5 | | Example 6 | | Comparative example 2 | |
| --- | --- | --- | --- | --- | --- | --- |
| | N+ | P+ | N+ | P+ | N+ | P+ |
| 0.15/0.25 | 10,600 | 2,840 | 6,710 | 1,950 | 20,800 | 3,490 |
| | (8,200) | (660) | (4,270) | (363) | (32,000) | (1,130) |
| 0.2/0.3 | 366 | 799 | 300 | 706 | 399 | 1,120 |
| | (93) | (58) | (57) | (40) | (205) | (206) |
| 0.3/0.4 | 155 | 451 | 159 | 480 | 154 | 536 |
| | (1.4) | (13) | (1.7) | (12) | (3) | (33) |
| 0.7/0.7 | 123 | 256 | 124 | 220 | 122 | 302 |
| | (1.1) | (7) | (1.3) | (3.4) | (1.1) | (11) |

Notes:
*For Examples 5–6 and Comparative example 2, the units are ohms per contact hole.
**Resistance values are based on a contact chain structure having 1,200 contact holes.
***Numbers appearing in paranthesis represent a standard deviation throughout 44 measured points.

As can be seen in Table 2, the resistance of the contact hole can be remarkably reduced according to a method for forming a wiring layer of the present invention in comparison with that according to a conventional method.

Additionally, it should be noted that the resistance value at the contact hole in these examples can be greatly decreased according to the heat-treatment method of the present invention, and more significantly at the p+ impurity-doped region 57' than at the n+ impurity-doped region 57. Also, although the temperature in the heat-treatment step was increased to 650° C. similar resistance values as in Examples 5 and 6 have been obtained.

While the present invention has been particularly shown and described with reference to particular examples thereof, it will be understood by those skilled in the art that various changes in form and details may be effected therein without departing from the spirit and scope of the invention as defined by the appended claims.

What is claimed is:

1. A method for manufacturing a semiconductor device, comprising the steps of:

forming an insulating layer on a semiconductor substrate having an impurity-doped region therein, the insulating layer having a contact hole exposing the impurity-doped region;

forming a first diffusion barrier layer on the inner surface of the contact hole and on the surface of the semiconductor substrate which is exposed by the contact hole;

after said step of forming the first diffusion barrier layer is completed, heat-treating the first diffusion barrier layer at a pressure no greater than about 4 mTorr;

forming a metal layer on the second diffusion barrier layer; and patterning the metal layer and the first and second diffusion barrier layers, thereby providing a metal wiring layer.

2. A method as in claim 1, wherein the first diffusion barrier layer is comprised of titanium.

3. A method as in claim 1, further comprising the step of:

heat-treating the second diffusion barrier layer in a nitrogen atmosphere.

4. A method as in claim 3, wherein the step of heat-treating the second diffusion barrier layer is performed for about 30 minutes to one hour at a temperature of about 400° C. to 500° C.

5. A method as in claim 1, wherein said step of heating the first diffusion barrier layer is performed at a temperature between about 450° C. to 650° C.

* * * * *

UNITED STATES PATENT AND TRADEMARK OFFICE
CERTIFICATE OF CORRECTION

PATENT NO. : 5,502,004
DATED : March 26, 1996
INVENTOR(S) : PARK, Chang-Soo

It is certified that error appears in the above-identified patent and that said Letters Patent is hereby corrected as shown below:

Claim 1, column 8, after line 67, please insert the following:

--forming a second diffusion barrier on the
    heat-treated first diffusion barrier layer;--

Signed and Sealed this

Twenty-fifth Day of May, 1999

Attest:

Q. TODD DICKINSON

*Attesting Officer*     *Acting Commissioner of Patents and Trademarks*